US006664128B2

(12) United States Patent
Tong et al.

(10) Patent No.: US 6,664,128 B2
(45) Date of Patent: Dec. 16, 2003

(54) BUMP FABRICATION PROCESS

(75) Inventors: Ho-Ming Tong, Taipei (TW);
Chun-Chi Lee, Kaohsiung (TW);
Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yu-Chen Chou, Kaohsiung (TW); Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,716

(22) Filed: Feb. 12, 2003

(65) Prior Publication Data
US 2003/0166330 A1 Sep. 4, 2003

(51) Int. Cl.⁷ .............................................. H01L 21/44
(52) U.S. Cl. ....................................... 438/106; 438/614
(58) Field of Search ................................ 438/106, 118, 438/612, 613, 614

(56) References Cited

U.S. PATENT DOCUMENTS

| | | | | | |
|---|---|---|---|---|---|
| 4,922,322 | A | * | 5/1990 | Mathew | 357/69 |
| 5,108,950 | A | * | 4/1992 | Wakabayashi et al. | 438/613 |
| 5,508,229 | A | | 4/1996 | Baker | |
| 6,232,212 | B1 | * | 5/2001 | Degani et al. | 438/612 |
| 6,235,552 | B1 | * | 5/2001 | Kwon et al. | 438/106 |
| 6,251,501 | B1 | * | 6/2001 | Higdon et al. | 438/209 |
| 6,281,106 | B1 | * | 8/2001 | Higdon et al. | 438/613 |
| 6,375,062 | B1 | * | 4/2002 | Higdon et al. | 228/214 |
| 6,407,459 | B2 | * | 6/2002 | Kwon et al. | 257/780 |
| 6,479,376 | B1 | * | 11/2002 | Huang et al. | 438/613 |

* cited by examiner

Primary Examiner—Carl Whitehead, Jr.
Assistant Examiner—David S Blum
(74) Attorney, Agent, or Firm—Jiang Chyun IP Office

(57) ABSTRACT

The present invention provides a bump fabrication process. After forming an under bump metallurgy (UBM) layer and bumps in sequence over the substrate, the under bump metallurgy layer that is not covered by the bumps is etched with an etchant. The etchant mainly comprises sulfuric acid and de-ionized water. The etchant can etch the nickel-vanadium layer of the UBM layer without damaging the bumps.

15 Claims, 4 Drawing Sheets

BUMP FABRICATION PROCESS

CROSS REFERENCE TO RELATED APPLICATIONS

This application claims the priority benefit of Taiwan application serial no. 91103736, filed Mar. 01, 2002.

BACKGROUND OF INVENTION

1. Field of Invention

The present invention relates to a fabrication process for forming bumps. More particularly, the present invention relates to an etching process for the under bump metallurgy layer in the bump fabrication process.

2. Description of Related Art

At present, the market of multimedia applications rapidly expands. The integrated circuit (IC) packaging needs to be improved following the developing trends of electronic devices such as digitalization, network localization, and user friendliness. In order to meet the above requirements, electronic devices must have multiple functions and high integration and maintain high operating speed, miniaturization, lightweight, and low cost. High-density packages, such as ball grid arrays (BGAs), chip scale packages (CSPs), flip chips, and multi-chip modules (MCMs) have been developed. The integrated circuit packaging density is determined by the degree of numbers of pins per area unit. For high-density IC packaging, the signal transmitting speed increases as the wiring length decreases. Thus, the application of bumps has become the main trend in the high-density packaging.

Referring to the FIG. 1, a conventional fabrication process for forming bumps is illustrated in the flow chart. In step 100, a wafer is provided with a plurality of bonding pads and a protective layer protecting the wafer. In step 102, an under bump metallurgy (UBM) layer is formed over the wafer. The UBM layer includes an adhesion layer, a barrier layer, and a wetting (solder) layer. In step 104, after forming the UBM layer, a photoresist layer is formed over the wafer with a plurality of openings, which opening will later on be the formation locations of bumps. In step 106, solder paste is filled into the openings of the photoresist layer to form bumps. After forming the bumps, in step 108, the photoresist layer is removed, so that the UBM layer, except the locations covered by the bumps, is exposed. Subsequently, in steps 110, 112 and 114, etching is performed to the wetting layer (110), the barrier layer (112) and the adhesion layer (114), respectively.

Materials used in the UBM layer include metals, such as, aluminum, nickel or copper. For UBM layers made of different metal materials, different etchants are selected for the etching process. Nitric acid is usually used for etching the copper layer or the nickel layer, while phosphoric acid of 80 wt. % or more is used for etching the aluminum layer. In the above fabrication process for forming the bump, the UBM layer is removed through several etching steps with different etchants. Moreover, after each etching step, one cleaning step is required to avoid contamination. Therefore, the etching process of the UBM layer is costly and the above fabrication process is time-consuming.

In U.S. Pat. No. 5,508,229, an one-step etching process is proposed for etching the UBM layer over the substrate. The UBM layer is a stacked layer of aluminum/nickel-vanadium/copper. After the bump is formed, an etchant consisting of, phosphoric acid, de-ionized water, acetic acid and hydrogen peroxide is used to remove the aluminum/nickel-vanadium/copper stacked layer at once. Besides, concentrations of phosphoric acid, de-ionized water, acetic acid and hydrogen peroxide are 1% –25%, 63%–8%, 1%–10%, 0.1%–2%, respectively, while the etching temperature is about 70° C. with an etching time of about 90–600 seconds.

From the disclosure of the U.S. Pat. No. 5,508,229, the etching rate is controlled or adjusted by changing the concentrations of the etchant, the etching time or the etching temperature. However, the etching rate can only be adjusted within a very limited range in such way.

SUMMARY OF INVENTION

The present invention provides a bump fabrication process by using a solution containing sulfuric acid as an etchant for etching the nickel-vanadium layer of the under bump metallurgy (UBM) layer.

The present invention provides a bump fabrication process by using a solution containing sulfuric acid as an etchant for removing the nickel-vanadium layer and the copper layer of the under bump metallurgy (UBM) layer altogether.

The present invention provides a bump fabrication process by using a solution containing sulfuric acid as an etchant for removing the stacked aluminum/nickel-vanadium/copper (Al/NiV/Cu) layer of the under bump metallurgy (UBM) layer at once.

The present invention provides a bump fabrication process, in which process the applied voltage controls the etching rate for the thin metal layer.

As embodied and broadly described herein, the present invention provides a bump fabrication process. After forming an under bump metallurgy (UBM) layer and bumps over the substrate, the under bump metallurgy layer that is not covered by the bumps is etched with an etchant. The etchant mainly comprises sulfuric acid and de-ionized water, while the concentration of sulfuric acid is in a range between about 0.5% to about 50% of the etchant. The etchant can etch the nickel-vanadium layer of the UBM layer without damaging the bumps.

The UBM layer includes an adhesion layer, a barrier layer, and a wetting (solder) layer. Materials for forming the UBM layer include aluminum, titanium, titanium-tungsten alloy, chromium, gold, silver, copper and nickel-vanadium alloy, for example.

According to the preferred embodiment, if the bonding pads are aluminum pads, materials of the UBM layer can be, for example, aluminum/nickel-vanadium/copper, titanium/nickel-vanadium/copper, titanium-tungsten/nickel-vanadium/copper or chromium/nickel-vanadium/copper. If the bonding pads are copper pads, materials of the UBM layer can be, for example, titanium/nickel-vanadium/copper, titanium-tungsten/nickel-vanadium/copper or chromium/nickel-vanadium/copper.

For etching the UBM layer, an electrolytic cell containing the etchant is provided with an anode and a cathode. The substrate is arranged on the anode and a voltage is applied between the anode and the cathode. The etching rate of the nickel-vanadium alloy layer is controlled by the electrolysis reaction occurring in the electrolytic cell.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
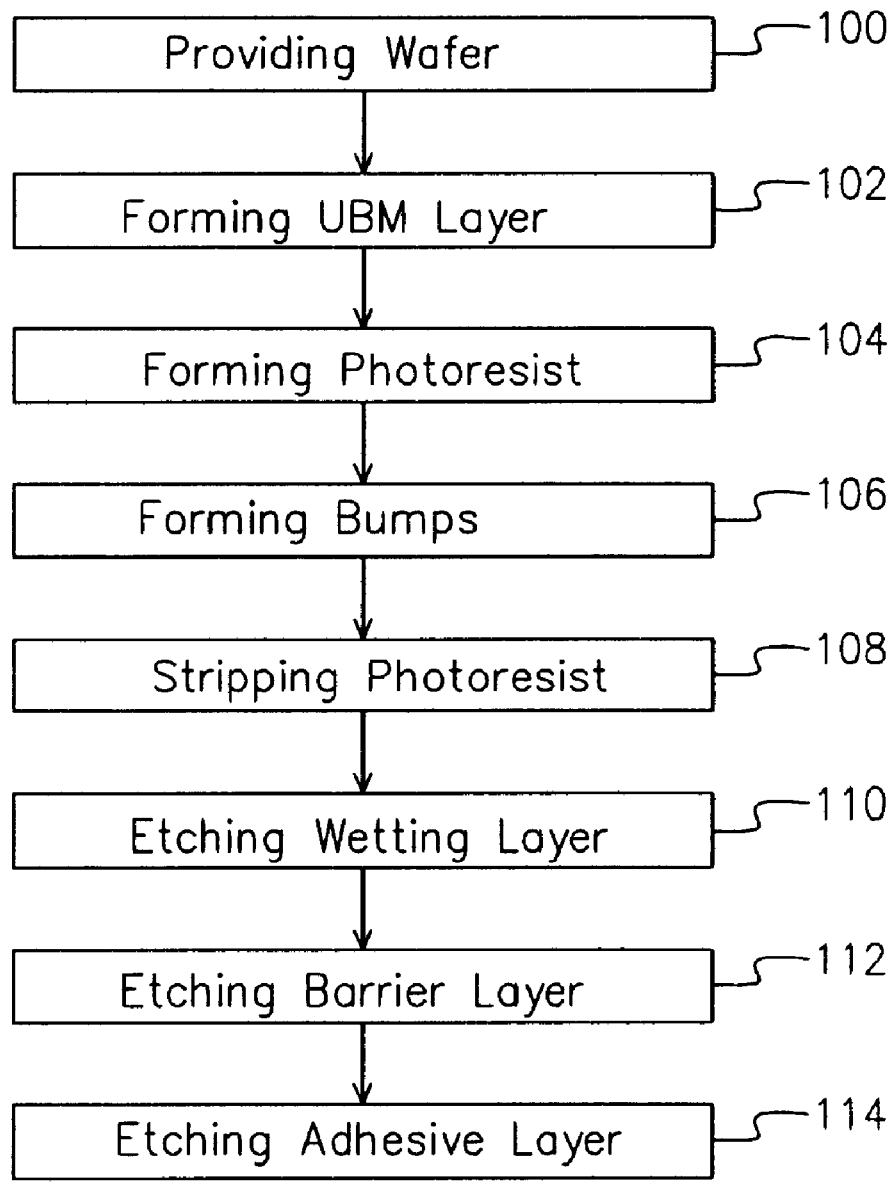
FIG. 1 is a flow chart illustrating the conventional fabrication process for forming bumps.
Figure 2:
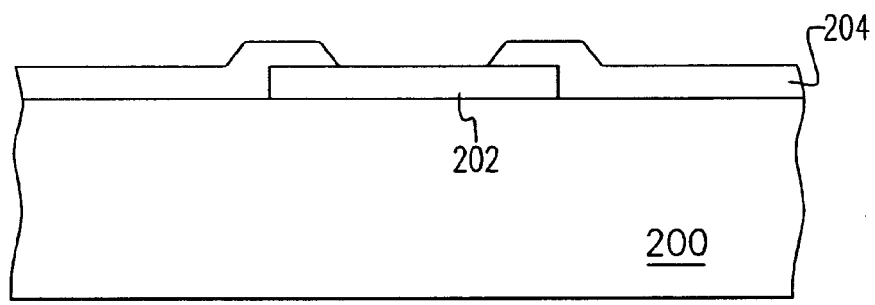
FIGS. 2–6 are cross-sectional views illustrating steps of a bump process according to one preferred embodiment of this invention.

FIGS. 2–6 are cross-sectional views illustrating steps of a bump process according to one preferred embodiment of this invention. As shown in FIG. 2, a substrate 200, such as, a wafer or a printed circuit board, is provided. According to one preferred embodiment of the present invention, a wafer is used as an example for the substrate. A plurality of bonding pads 202 and a protective layer 204 protecting a surface of the substrate are disposed on the substrate. For example, the protective layer 204 is disposed on the surface of the substrate 200, but exposes surfaces of the bonding pads 202. The bonding pads 202 are, for example, aluminum pads or copper pads.

Figure 3:
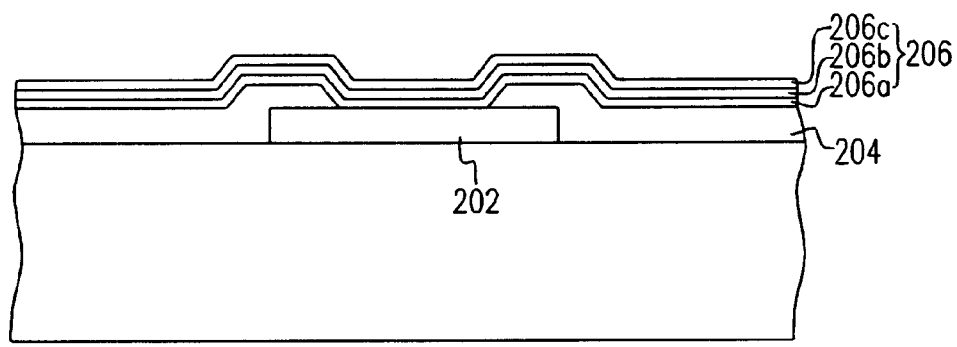

Referring to FIG. 3, an under bump metallurgy (UBM) layer 206 is formed over the substrate 200. For example, the UBM layer 206 covers the bonding pads 202 and the protective layer 204. The UBM layer 206 includes an adhesion layer 206a, a barrier layer 206b, and a wetting (solder) layer 206c. Materials for forming the UBM layer 206 (including the adhesion layer 206a, the barrier layer 206b and the wetting layer 206c) include aluminum, titanium, titanium-tungsten alloy, chromium, gold, silver, copper and nickel-vanadium alloy, for example.

Materials for forming the UBM layer 206 vary with the materials of the bonding pads 202. If the bonding pads 202 are aluminum pads, materials of the UBM layer 206 can be, for example, aluminum/nickel-vanadium/copper, titanium/nickel-vanadium/copper, titanium-tungsten/nickel-vanadium/copper or chromium/nickel-vanadium/copper. If the bonding pads 202 are copper pads, materials of the UBM layer 206 can be, for example, titanium/nickel-vanadium/copper, titanium-tungsten/nickel-vanadium/copper or chromium/nickel-vanadium/copper.

Figure 4:
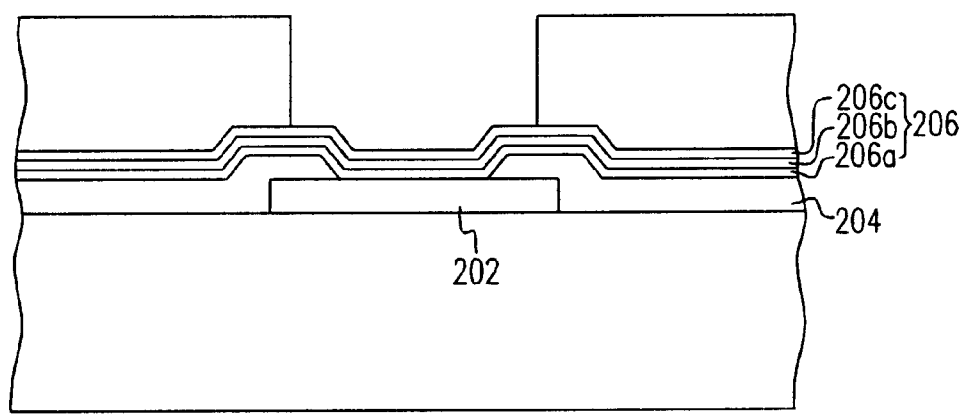

Referring to FIG. 4, after forming the UBM layer 206, a photoresist layer 208 is formed over the substrate 200 with a plurality of openings 210. The openings 210 will later on be the locations for forming bumps (solder filling). The locations of the openings 210, for example, correspond to the locations of bonding pads 202.

Figure 5:
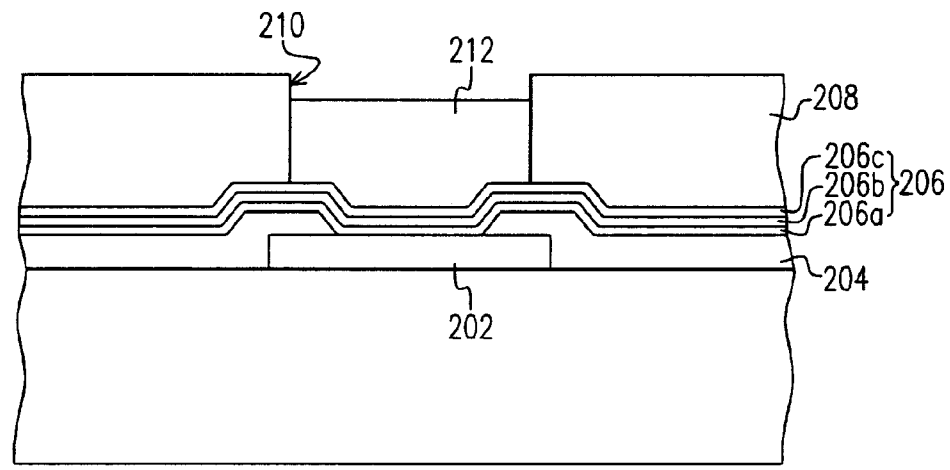
Figure 6:
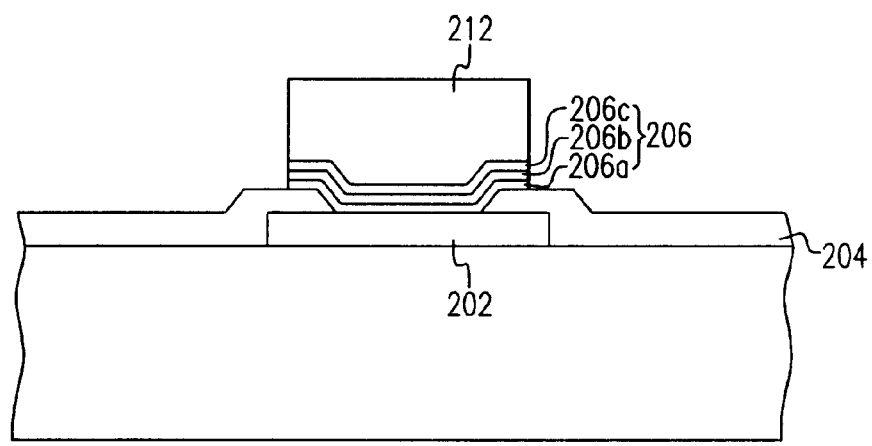

Referring to FIGS. 5–6, solder paste is filled into the openings 210 of the photoresist layer to form bumps 212. After forming the bumps 212, the photoresist layer 208 is removed, so that the UBM layer 206 except portions covered by the bumps, is exposed. Subsequently, an etching process is performed to the UBM layer 206 not covered by the bumps. The etchant used in the etching process has a composition mainly including sulfuric acid and de-ionized water, while the concentration of sulfuric acid is in a range between about 0.5% to 50% of the total etchant. The etchant of the present invention can etch the nickel-vanadium (alloy) layer in the UBM layer 206 on the bonding pad 202, without damaging the bumps 212, no matter the bonding pads 202 are aluminum pads or copper pads. Moreover, if the UBM layer 206 on the bonding pad 202 is a stacked aluminum/nickel-vanadium/copper layer, the etchant of the present invention can etch the nickel-vanadium layer together with the aluminum layer and the copper layer of the UBM layer 206. That is, the etchant of the present invention can successfully etch the nickel-vanadium layer, the aluminum layer and the copper layer without damaging the bumps 212. If the UBM layer 206 is a layer of aluminum/nickel-vanadium/copper, titanium/nickel-vanadium/copper, titanium-tungsten/nickel-vanadium/copper or chromium/nickel-vanadium/copper, the etchant of the present invention can successfully etch the nickel-vanadium layer and the copper layer of the UBM layer 206. Therefore, the etchant of the present invention can etch more than one metal layer in one etching process, thus simplifying the process steps, reducing the process time, increasing the yield and reducing the production cost.

Figure 7:
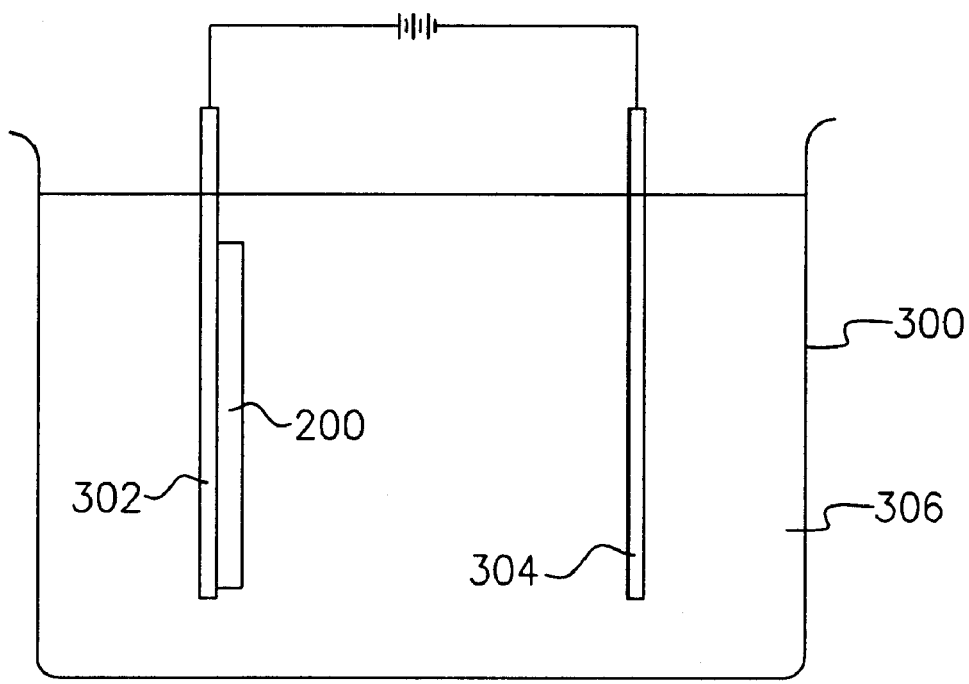
FIG. 7 illustrates the etchant controlled by electrolysis reaction for etching the UBM layer according to one preferred embodiment of the present invention.

FIG. 7 illustrates the etchant controlled by electrolysis reaction for etching the UBM layer according to one preferred embodiment of the present invention. For etching the UBM layer 206 above the substrate 200, an electrolytic cell 300 with an anode 302 and a cathode 304 is provided. The etchant 306 is arranged within the electrolytic cell 300, while the substrate 200 is arranged on the anode 302. As a voltage is applied between the anode 302 and the cathode 304, the etching rate of the nickel-vanadium alloy layer is controlled by the electrolysis reaction occurring in the electrolytic cell 300. According to the preferred embodiment, the etching rate of the nickel-vanadium layer by the etchant 306 can be increased through control of the voltage between the anode 302 and the cathode 304.

In conclusion, the bump fabrication process of the present invention has at least the following advantages:

(1) The bump fabrication process of the present invention causes very little damage to the bumps by using the etchant containing sulfuric acid to etch the UBM layer.

(2) In the bump fabrication process of the present invention, the etching rate of the UBM layer by the etchant can be controlled by the electrolysis reaction between the etchant and the UBM layer.

(3) If the UBM layer is an aluminum/nickel-vanadium/copper layer, the etchant of the present invention can etch the nickel-vanadium layer, the aluminum layer and the copper layer of the UBM layer altogether.

(4) The bump fabrication process of the present invention can reduce the production cost by using the etchant containing sulfuric acid to etch the UBM layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bump fabrication process, comprising:
   providing a substrate with a plurality of bonding pads thereon;
   forming an under bump metallurgy layer, the under bump metallurgy layer comprising a nickel-vanadium layer and at least a conductive layer;
   forming a plurality of bumps on the under bump metallurgy layer above the bonding pads; and
   etching the nickel-vanadium layer that is not covered by the bumps with an etchant, wherein the etchant comprises sulfuric acid and de-ionized water.

2. The process of claim 1, wherein a material for forming the conductive layer is selected from the following group consisting of aluminum, titanium, titanium-tungsten alloy, chromium, gold, silver and copper.

3. The process of claim 1, wherein the bonding pads are aluminum pads.

4. The process of claim 3, wherein the under bump metallurgy layer comprises a layer selected from the following group consisting of an aluminum/nickel-vanadium/copper layer, a titanium/nickel-vanadium/copper layer, a titanium-tungsten/nickel-vanadium/copper layer and a chromium/nickel-vanadium/copper layer.

5. The process of claim 1, wherein the bonding pads are copper pads.

6. The process of claim 5, wherein the under bump metallurgy layer comprises a layer selected from the following group consisting of a titanium/nickel-vanadium/copper layer, a titanium-tungsten/nickel-vanadium/copper layer and a chromium/nickel-vanadium/copper layer.

7. The process of claim 1, wherein the step of forming a plurality of bumps comprises:

forming a photoresist layer on the under bump metallurgy layer, wherein the photoresist layer has a plurality of openings and the openings corresponds to the bonding pads;

filling a solder paste into the openings; and removing the photoresist layer.

8. The process of claim 1, wherein a concentration of sulfuric acid ranges between about 0.5% and about 50% of the etchant.

9. The process of claim 1, wherein the step of etching the nickel-vanadium layer further comprises:

providing an electrolytic cell having the etchant therein;

providing an anode and a cathode;

placing the substrate on the anode; and applying a voltage between the anode and the cathode, thereby an electrolysis reaction in the electrolytic cell controlling an etching rate of the under bump metallurgy layer.

10. A bump fabrication process, comprising:

providing a substrate with a plurality of bonding pads thereon;

forming an under bump metallurgy layer, the under bump metallurgy layer comprising at least two conductive layers, wherein a material for forming the conductive layers is selected from the following group consisting of aluminum, copper and nickel-vanadium alloy;

forming a plurality of bumps on the under bump metallurgy layer above the bonding pads; and etching the under bump metallurgy layer that is not covered by the bumps with an etchant, wherein the etchant comprises sulfuric acid and de-ionized water.

11. The process of claim 10, wherein the bonding pads are aluminum pads.

12. The process of claim 11, wherein the under bump metallurgy layer is an aluminum/nickel-vanadium/copper layer.

13. The process of claim 10, wherein the step of forming a plurality of bumps comprises:

forming a photoresist layer on the under bump metallurgy layer, wherein the photoresist layer has a plurality of openings and the openings corresponds to the bonding pads;

filling a solder paste into the openings; and removing the photoresist layer.

14. The process of claim 10, wherein a concentration of sulfuric acid ranges between about 0.5% and about 50% of the etchant.

15. The process of claim 10, wherein the step of etching the under bump metallurgy layer further comprises:

providing an electrolytic cell having the etchant therein;

providing an anode and a cathode;

placing the substrate on the anode; and applying a voltage between the anode and the cathode, thereby an electrolysis reaction in the electrolytic cell controlling an etching rate of the under bump metallurgy layer.

* * * * *